United States Patent [19]

Farina et al.

[11] 4,313,213
[45] Jan. 26, 1982

[54] COMPUTER CONTROLLED TELEVISION RECEIVER WITH DISPLAY

[75] Inventors: Attilio Farina, Torino; Pietro Belisomi, Pinerolo, both of Italy

[73] Assignee: Italiana S.p.A. Indesit Industria Elettrodomestici, Italy

[21] Appl. No.: 51,944

[22] Filed: Jun. 25, 1979

[30] Foreign Application Priority Data

Jun. 26, 1978 [IT] Italy .............................. 68491 A/78

[51] Int. Cl.³ .......................... H04B 1/16; H04N 5/50
[52] U.S. Cl. .................... 455/158; 455/183; 455/186; 358/192.1
[58] Field of Search ............... 455/158, 160, 161, 165, 455/168, 183–186; 358/191.1, 192.1

[56] References Cited

U.S. PATENT DOCUMENTS 3,882,400  5/1975  Hamada.

FOREIGN PATENT DOCUMENTS 1377100 12/1974 United Kingdom.
1401690  7/1975 United Kingdom.
1410363 10/1975 United Kingdom.
1445031  8/1976 United Kingdom.
1538294  1/1979 United Kingdom.
1540459  2/1979 United Kingdom.

OTHER PUBLICATIONS

UK Patent Application GB 2,003,683, 3/1979.
"Electronics Design", vol. 25, No. 3, 2/1/77.

Primary Examiner—Jin F. Ng
Attorney, Agent, or Firm—Ostrolenk, Faber, Gerb & Soffen

[57] ABSTRACT

A circuit arrangement for selecting a radioelectric signal from a number of signals receivable by a signal receiver equipped with a character display device to enable at least two selection modes of the radioelectric signal. The circuit arrangement has a controllable oscillator, the frequency of which is determined by a control loop depending on a binary number N supplied by a processing unit on the basis of code input data. The control loop has frequency dividing means providing a first signal from the controllable oscillator depending on the number N and the comparator for comparing the first signal with a second frequency reference signal to provide a third signal for the required tuning. A memory circuit has a number of cells for digital storage of data relevant to the signals being tuned into. The said number N can be supplied both in direct response to the coded input data or by calling up data from the memory circuit. On request, by using the display device the overall situation of the memory circuit can be displayed so as to keep the user informed as to which signals have been memorized and which and how many of the memory cells are available.

15 Claims, 5 Drawing Figures

COMPUTER CONTROLLED TELEVISION RECEIVER WITH DISPLAY

BACKGROUND OF THE INVENTION

The present invention relates to a circuit arrangement for selecting a radioelectric signal from among a number of signals received by a signal receiver equipped with a character display device, the said arrangement enabling at least two selection modes of the said radioelectric signal and comprising a controllable oscillator the frequency of which is determined by a control loop depending on a binary number N supplied by a processing unit on the basis of coded input data, the said loop consisting of frequency dividing means for obtaining a first signal from the said controllable oscillator depending at least on the said number N, means for comparing the said first signal with a second frequency reference signal for obtaining a third signal for required tuning, memorising means with a number of cells for digital storage of data relative to the signals being tuned into and, means for supplying the said number N both in direct response to the said coded input data and by calling up data from the said memorising means.

The system commonly used on television receivers for tuning into the required channels is the so-called FREQUENCY SYNTHESIZER system. This system, made possible by the advent of integrated circuits, offers a number of advantages over other known systems, such as the conventional potentiometer type MECHANICAL MEMORY systems used until recently and also over the more recent so-called VOLTAGE SYNTHESIZER systems. The frequency synthesizer system is fully electronic enabling any channel to be called up directly by the user who formulates the channel number on a keyboard or other control device. The system usually consists of a quartz-controlled reference oscillator, a phase lock loop, a programmable divider and a computer which supplies the number to be sent to the programmable divider in response to the number of the channel set by the user. See, for example, U.S. Pat. No. 3,882,400.

Thanks to the phase lock loop, for each channel number set by the user, the frequency of the local oscillator on the set is kept so stable and accurate that the set is perfectly tuned to the corresponding channel signal. For further details about frequency synthesizer tuning systems, refer to the article entitled "A Frequency Synthesizer for Television Receivers" by E. G. Breeze, published in the November, 1974 issue of the "Transactions BTR" magazine, or "Digital Television Tuner Uses MOS LSI and Non Volatile Memory" by L. Penner, published in the Apr. 1, 1976 issue of "Electronics".

The frequency synthesizer system lends itself well to a plurality of different television channel tuning applications (hereinafter selection modes):

(1) direct selection by formulating the required channel number as described above (as is known, television channels are numbered: for example, on the European C.C.I.R. standard, V.H.F. band channels are numbered from 2 to 12 and U.H.F. band channels from 21 to 69: on the American standard VHF channels are numbered from 2 to 13 and UHF from 14 to 83).

(2) memory selection; each of a certain set of keys corresponds to a given channel, selected and memorized beforehand.

(3) automatic scanning of all the channels of a given standard, of all the channels contained in the memory or continuous scanning of all the frequency bands involved.

The first application enables immediate, direct selection of any one of the channels on the relative standard (60 in Europe, 82 in America).

The second enables faster detection of one of a limited number of preferred channels.

The third is a fast, simple way of finding out which standard channels can be received, which channels have been memorized and whether other broadcasting stations exist on non-standard frequencies such as the private broadcasting stations in Italy (there are currently over a hundred operating).

Examples of frequency synthesizer systems with this wide range of selection modes are described in West German Patent Application Nos. 26 45 833 and 26 52 185 and, in particular, U.S. Patent Application Ser. No. 971,073.

All these modes, which are particularly useful in areas where a number of broadcasting stations can be received, require highly complex control equipment which many users may find difficult to operate. This is even more so if, besides emitter selection and standard receiver adjustment controls (volume, brightness, colour, etc.), provision is also made for additional accessory functions such as a digital clock which required additional setting controls.

An aim of the present invention is to provide a circuit arrangement for a television receiver enabling the many functions described above to be affected simply and cheaply with as little operating difficulty as possible on the part of the user.

BRIEF DESCRIPTION OF THE INVENTION

According to one aspect of the present invention, there is provided an apparatus, comprising:
(A) tuner means for tuning said television receiver to a frequency determined by a control signal applied thereto;
(B) display means for displaying visual information;
(C) control means operable in a direct selection tuning mode, a memory selection tuning mode and a memory display tuning mode;
(D) a keyboard including a plurality of keys, said keyboard enabling the operator of said television receiver to select the mode of operation of said control means and to enter frequency data indicative of the desired tuning frequency of said tuner means;
(E) memory means having a plurality of storage locations, each of said storage locations being capable of storing key information relating a respective one of said keys to a desired tuning frequency; and
(F) said control means for:
 (1) adjusting the value of said control signal to cause said tuner means to tune to a frequency determined by frequency data entered into said keyboard by the operator of said television receiver when said control means is operated in said direct selection tuning mode;
 (2) adjusting the value of said control signal to cause aid tuner means to tune to one of said tuning frequencies stored in said memory means when said control means is operated in said memory selection tuning mode;

(3) causing said display means to display memory information indicating which of said storage locations contains key information and which of said storage locations does not contain key information once the control means is operated in said memory display mode.

According to another aspect of this invention, there is provided (A) a keyboard including a plurality of keys;
(B) memory means for storing receiver operation information indicating a desired tuning frequency as well as other desired operating parameters of said television receiver;
(C) said keyboard permitting the operator of said television receiver to enter said receiver operation information to be stored in said memory means and also to cause stored receiver operation information to be read out of said memory means;
(D) control means responsive to the operation of said keyboard and operable in a first mode wherein new receiver operation information is read into said memory and a second mode wherein said stored receiver operation information is read out of said memory and causes said television receiver to be operated in accordance with said receiver operation information;
(E) means for calculating a first numerical value corresponding to a predetermined combination of new receiver operation information as it is first stored in said memory means;
(F) means for memorizing said first numerical value;
(G) means for calculating a second numerical value corresponding to said predetermined combination of stored receiver operation information as said stored receiver information is read out of said memory; and
(H) means for comparing said first and second numerical values.

BRIEF DESCRIPTION OF THE DRAWINGS

An embodiment of this invention will now be described, by way of example, with reference to the accompanying drawings, in which.

DETAILED DESCRIPTION OF THE INVENTION

Figure 1:
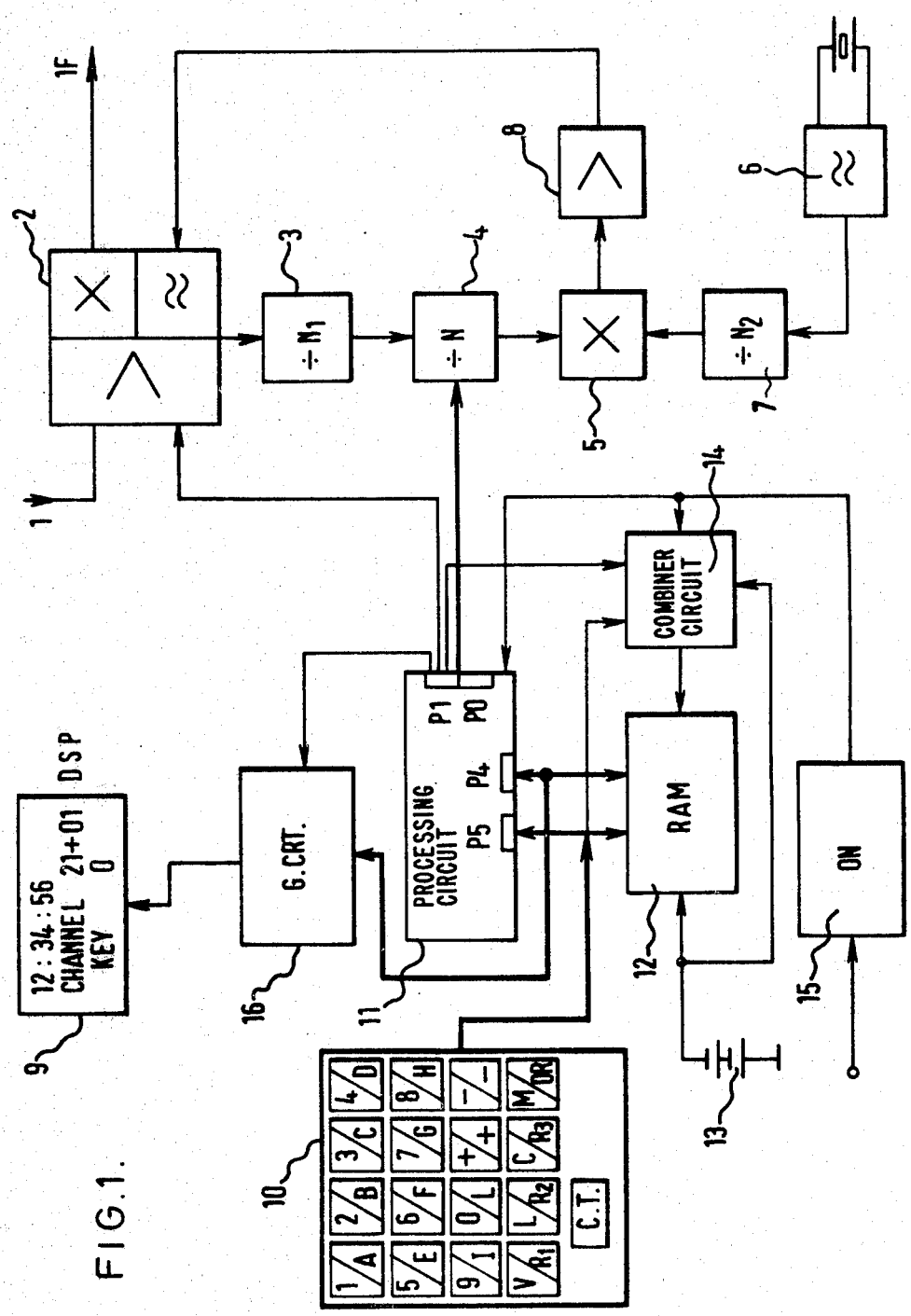
FIG. 1 is a block diagram of part of a television receiver according to the present invention.

Referring now to FIG. 1, numeral 1 indicates a receiving aerial connected to varicap-diode tuner 2 at the output of which a signal converted to intermediate frequency IF is available. The tuner is the known type and consists essentially of a selective amplifier stage, a mixer circuit and local oscillator circuit.

One output of the local oscillator circuit is connected to a first frequency-divider circuit 3 which divides by a fixed number N1 and whose output is connected to the signal input of a second divider 4 which divides by a variable number N determined by 12-bit input thereto, so that it can divide by any number from 1 to $2^{12}$.

The output of divider 4 is connected to a first input of phase-frequency comparator circuit 5 to whose second input a frequency signal generated by quartz generator 6 is supplied via a third frequency-divider circuit 7. The output of comparator circuit 5 is connected to the tuner circuit varicap diode voltage control input via amplifier and filtering circuit 8.

Numeral 10 indicates a control unit consisting of a keyboard which contains 10 number keys marked 0 to 9 (or letter keys marked A, B, C, D, E, F, G, H, I, L) and 7 auxiliary keys marked +, −v, V, L, C, M, CT (or +, −, R1, R2, R3, OR, CT) and other control keys (such as the on/off switch) which are not shown.

This control unit is connected to a first group of eight input-output terminals of processing unit 11 and the address inputs of memory circuit 12. The processing unit 11 also has a second set of eight input output terminals connected to the data input-output terminals of memory circuit 12 and the inputs of character generator circuit 16. This, in turn, is connected to display device 9 (including the cathode ray tube of the set) while a third group of 16 terminals is connected to:

12 programming inputs of 12-bit divider 4;
2 band-switch inputs (U and BIII) of tuner 2;
1 control input of character generator circuit 16; and
a first input of combiner circuit 14.

Memory circuit 12 has further control terminals connected to the input of combiner circuit 14 which receives a signal from circuit 11 at a second input and a signal from on-detector circuit 15 at a third input. Circuit 15 receives a signal from the power mains to which the television set is connected and also has its output connected to a RESET input of circuit 11.

Memory 12 and the low-current-absorption CMOS combiner circuit 14 are connected to a local battery supply source 13; the circuit operates as follows:

Circuits 3, 4, 5 and 8, together with the varicap-diode-controlled local oscillator (VCO) in tuner 2, form a phase lock loop controlled by the reference signal generated by quartz generator 6 and divided by divider 7 according to the known technique.

The function of divider circuit 3 is to reduce the frequencies involved to more easily processable levels while programmable divider 4 enables locking to be effected for a number of local oscillator frequencies, that is, it acts as a frequency synthesizer circuit.

In fact, after selecting division number N for divider circuit 4, phase-frequency comparator 5 supplies circuit 2, via amplifier 8, with voltage for obtaining the following condition:

(1) $\quad \dfrac{f6}{N_2} = \dfrac{f2}{N_1 \cdot N} \quad$ or (2) $\quad f2 = P \cdot N \quad$ in which f2 is the oscillation frequency of the local oscillator circuit in tuner 2, f6 is the oscillation frequency of reference oscillator circuit 6, $N_2$, $N_1$ and N are the division ratios of dividers 3, 6 and 4 respectively, while $P = f6 \cdot (N_1/N_2)$ indicates the system pitch, that is, the amount by which local oscillator frequency varies with variations in number N.

The receiver must be capable of tuning into broadcasting stations of a given transmission standard, e.g. C.C.I.R. B-G, with channelling as agreed at the 1961 European Radio Broadcasting Conference in Stockholm, that is, broadcasting stations with one-step spacing between adjacent 7 MHz channels on the I and III (VHF) bands and 8 MHz channels on the IV and V (UHF) bands with a 5 MHz video signal band width. These broadcasting stations fall within television channels 2 and 69 (video carrier frequencies 48.25 and 855.25 MHz respectively) with 38.9 MHz intermediate frequency IF. This means the local oscillator on the tuner must be capable of generating frequencies ranging from 87.15 to 894.15 MHz. A 0.25 MHz pitch was selected which, according to equation 2 gives the following values for the two above mentioned channels:

$$N_{min} = \frac{87.15}{0.25} \quad \frac{87}{0.25} = 348$$

$$N_{max} = \frac{894.15}{0.25} \quad \frac{894.25}{0.25} = 3577$$

By varying number N between this maximum and minimum, any television channel on the VHF and UHF bands can be tuned into with a maximum error of 125 KHz.

Not all of this frequency range can be utilized so the tuner is provided with two band switch input U (UHF/VHF) and B (BIII/BI) to ensure only effective bands are covered. Divider 3 is a high-speed ECL type which divides by 64 (SP 8750). Divider 4 is a programmable TTL which can operate up to frequencies of about 15 MHz ($3 \times$ SN74LS191). Circuits 5, 6 and 7 consist of an SP8760 integrated circuit with 250 KHz frequency quartz and N=64 division ratio so that comparator circuit 5 operates at 3906.25 Hz frequency which corresponds to a quarter of line frequency. The function of amplifier and filter 8 is to adapt the output level of comparator 5 (max 5 V) to the requirements of tuner 2 (max 30 V) and provide the best possible filtering and lock speed conditions.

Circuit 11, which consists of a microprocessor unit, is designed to generate, among other things, N numbers and bandswitch signals for tuning into specific television broadcasting stations on the basis of data relative to the signals being tuned into supplied by the user from control keyboard 10. The circuit 11 is also capable of supplying or receiving signals from memory 12 and sending signals to character generating circuit 16.

Number N is calculated using the following equation:

$$N = (K.F + C) \cdot 4 + S \quad (3)$$

The operations shown are performed by means of a series of elementary operations by the arithmetical-logic unit (ALU) on the basis of instructions contained in the (ROM) program memory contained in the said processing circuit 11 and performed, in this case, using an F8 microprocessor. Constant correction C and factor F depend on the band selected; K is the channel number according to the said standard and the S variable can be changed for performing fine tuning corrections.

If channel number K is changed, we only get the frequencies corresponding to standard channels with a pitch equal to F (8 MHz for UHF and 7 for VHF), whereas one-unit variation of S causes frequency shifts of 0.25 MHz.

With appropriate control from the keyboard, various modes are possible for tuning into a given broadcasting station partly using known methods.

Whenever any one of the keys is pressed, processing unit 11 sends an ISO-coded 48-character sequence to character generator 16 which is displayed on the television screen in a three 16-character line arrangement.

There are essentially three types of display:
(1) Normal display: the first line shows the time (hours, minutes, seconds); the second contains the "CHANNEL" display followed by the channel number (that is, the number it goes by in the relative standard) and, possibly, a number ranging from "01" to "16" preceded by a "+" or "−" sign to show the tuning correction as compared with the nominal value; in the case of memory selection, the third line displays "KEY" followed by the relative key number, Additional indications may be displayed (asterisks of alphanumerical symbols) as explained below.
Example of normal display:
  12:34:56
  CHANNEL—21+01
  KEY—0
(2) Analogue level display: the first line displays the letter "V" followed by a number of characters (asterisks, hyphens, etc) ranging from 0 to 12 and proportional with the volume level; the second and third lines display the letters "L" and "C", respectively, followed by a number of characters with analogue significance indicating brightness and colour levels.
Examples of analogue level display:
  V====
  L********
  C******
(3) Memory map display: the first line contains four numbers (or letters for Italian channels) with two "BLANK" spacing (three for the letters) indicating the channels memorized by keys 1 to 4; similarly, the second line displays the numbers (or letters) of channels memorized by keys 5 to 8; the third line displays the channel numbers memorized by the last two keys (9 and 0); in the bottom right-hand corner, "M?" characters are displayed to show the device is waiting for a memorizing operation, in that this type of display appears by pressing memory key "M" as described below. Example of memory map display:

| 02 | 05 | 12 | 21 |
| L  | 23 | 30 | 54 |
| ?? | 65 |    | M? |

The normal display always includes a time indication (hours, minutes, seconds). The remainder consists partly of fixed data from the ROM program memory (e.g. "CHANNEL" and "KEY" shown in FIG. 1) and partly of variable data depending on the controls activated by the user and the situation resultant from them which is memorized in a memory buffer inside unit 11 (e.g. FIGS. 21-01 in FIG. 1 following the "CHANNEL" indication which show the channel number and tuning correction).

The time indication is corrected automatically each second even if no key is pressed.

Provision is usually made on the set for memory selection. When a numbered key is pressed (1 . . . 0), the set tunes into the channel memorized previously and associated with that number.

Tuning, volume, brightness and colour levels assume the same values as when the channels was memorized. How this is done will be explained below.

A display of the first type also appears, as shown in FIG. 1, which assumes key "0" has been pressed and channel 21 memorized with a + one step tuning correction. When the "+" key is pressed, the following display appears:
  12:34:56
  CHANNEL 21+02
  KEY 0

This tells the user that over-tuning corrections are being made, that is, towards the audio carrier of the received video signal. Of course, circuit 11 consequently supplies the programmable divider circuit with a new number N and this tuning condition is automatically associated with key 0.

The same thing happens when the "−" key is pressed except that, in this case, tuning is varied towards the video.

When nominal tuning is reached, the "+" sign and the number after it are cancelled. In the case of under-tuning, the "−" sign appears followed by the number of shifts made. The system is designed to limit adjustments to a maximum of −16 and +15.

If, however, a second number key (e.g., 5) is pressed after the first (e.g., 6) within a given time period (e.g. two seconds), the set switches to direct selection and the channel associated with the number of the two keys pressed is turned into (nominal tuning). In this case, the display is of the first type showing:

12:34;56
CHANNEL 65

The absence of the "KEY" indication tells the user he is in direct selection mode.

Tuning, of course, can be corrected in the same way even when the set is operating in direct selection mode, though, in this case, the tuning correction operation is not combined with automatic memorization. For the channel to be memorized together with the tuning condition, the "M" key must be pressed, followed by a number key. Pressing key "M" sets the corresponding operation mode which is memorized in the memory buffer of processing unit 11. As a guideline for the user for the next operation, a first type display appears again only this time with "M" characters shown in the bottom right-hand corner:

12:34:56
CHANNEL 65
KEY M?

At the same time, to inform the user that the device is preparing to change the content of the channel memory, a short warning signal is sounded (see the FIG. 5 description below). If the user now presses a number key, the channel tuned into (channel 65 in the example), with volume, brightness and colour levels (how to adjust these will be explained later on) and any tuning correction made, will be associated in the memory with the number key pressed. If, for example, the number 7 key is pressed, the display will show:

12:34;56
CHANNEL 65
KEY 7

If, before memorizing the channel, the user wants to check up on the memory situation without losing the channel tuned into and the relative adjustments, all he has to do is press key "M" once more. In response to key M being pressed, the device remains set for memorizing but, at the same time, switches to the third type of display to show what was seen earlier in the third type display description. If one of the memory cells is free, it is shown by two question marks (e.g. cell 9) and can be used for memorizing the new channel. If none of the cells is free, the user can choose to replace a minor memorised channel with the new one: all that is needed to do this is to press the required number key. When this is pressed, the device switches from "memory" mode to normal display and normal (memory) selection mode.

When the "CT" key is pressed, three asterisks appear in the top right-hand corner:

12:34;56 ***
CHANNEL 65
KEY 7

Display of the asterisks tells the user that the device is being set to perform a further series of functions corresponding to the second indication relative to each key. Following this operation, processing circuit 11 also supplies character generator 16 with a switch signal so as to change the colour of the display characters on the screen or the background color in the area of the display and make it even clearer to the user that, from that moment on, the controls available are those corresponding to second key significance (that is, only in the case of a color set). By pressing any one of the keys marked "A" to "L", the display shows:

12:34:56 ***
CHANNEL A

This tells the user that the television is set to mode "C" but Italian standard channels can be selected direct by pressing any one key with display of the received channel. If key R1, R2 or R3 is pressed, for example, the display shows (assume R1 is pressed):

12:34:56 ***
CHANNEL 21-01
KEY 0 R1

This tells the user that the set is performing an automatic type 1 scanning operation or is scanning all the channels in the memory.

Scanning progresses automatically every two seconds with indications in each case of the key number and associated channel. At the same time, processing circuit 11 generates the relative N numbers for receiving the channel. Scanning stops when any other key is pressed. If the "+" or "−" key is pressed, the device remains set for manual advance or reversing (every time the "+" key is pressed, the key number is increased and decreased every time the "−" key is pressed). If the "CT" key is pressed, the device switches back to the first keyboard and awaits further instructions, in particular, tuning correction or memorization controls. Similarly, if key R2 is pressed after selecting the second keyboard using the "CT" key, this starts a type 2 scanning operation of all the standard channels (one switch per second). This can be stopped in the same way as type 1 scanning.

If key R3 is pressed, this starts a continuous scanning operation of the frequency band in 1 MHz steps, that is, 4 fine tuning switches per second, to detect any emitters operating over non-standard frequencies.

The "KEY" indication is not displayed during type 2 and 3 scanning operations.

Display or omission of the fixed "CHANNEL" and "KEY" indications depends on whether the indication or blank sectors of the ROM memory are utilized.

When key "OR" is pressed, the display shows:

??:??:?? ***
CHANNEL 21+01
KEY 0 OR

This tells the user that the television set is still set to mode "T", that it is tuned to channel 21 with a tuning correction equivalent to one frequency shift over 250 KHz, memorised on key 0, and that the device expects six number keys to be pressed one after the other corresponding to the hours, minutes and seconds the clock is to be reset to. As the said six keys are pressed, the corresponding number is displayed in place of the "OR"

indication and pairs of numbers replace the "??" corresponding to the hours, minutes and seconds, provided the numbers are acceptable.

In fact, the device checks the set numbers and, if the hour number is over 23 or the number corresponding to the tens of the minutes or seconds over 5, the two numbers (hours, minutes or seconds) are rejected and the two question marks are left displayed to inform the user that the device is waiting for another pair of acceptable numbers to be set. After the operation has been performed, the clock starts counting from the time set by the user.

The device is so designed that, following a power cut, series of zeros is displayed for the hours, minutes and seconds and the clock remains in this condition to inform the user that the power supply has temporarily been cut off.

Finally, by pressing key V (first keyboard), the device is set for volume adjustments and, at the same time, switches to a second type display as shown earlier.

The "=" beside the letter "V" (the other lines have "*") show the parameter being adjusted.

If the "+" (or "−") key is now pressed, the processing unit commences an automatic increase (or decrease) of the content of a particular register. At the same time, the processing unit provides for alteration of the television volume control signal and the number of characters showing the level reached on the display as follows:

V>>>>>>>
L*****
C******

The ">" sign indicates an upward adjustment (downward adjustments are shown by the sign "<"). Once the required level is reached, adjustment can be stopped by pressing key "+" (or "−") once more.

If circuit 11 also comprises a timer which, 15 seconds after the last key has been activated, supplies a switch signal (BIT 6 PORT 1) to character generator 16 which reduces the display to one line and also halves the height of the characters (7 instead of 14 television lines) to reduce disturbance to the picture, this switch signal, of course, is not supplied during automatic scanning or clock adjustment. To prevent memorised data being lost during a power cut, provision is made for a battery-supplied outside RAM memory 12. Whenever a memorization operation is performed, processing unit 11 updates the information in the RAM memory. When power supply returns to normal, the same unit 11 calls up the channel number data memorized in the RAM memory and enters it on an internal memory table for displaying the memorized channel map, if necessary, as explained earlier. The unit also provides for initiating the device in the memory selection mode in the same way as if the 0 key had been pressed.

In exactly the same way as when a number key is pressed in normal (memory) selection mode, unit 11 withdraws data from the external RAM relative to the key pressed (channel number, tuning, volume, brightness and colour levels) and checks they are within the preset range: if they are not (e.g. the channel number is not acceptable or tuning is over or below 16), unit 11 inserts two "??" on the display (or relative table) in place of the channel number and assigns nominal values both to tuning and analogue levels.

"ON RESET" circuit 15 and combiner circuit 14 protect the data contained in RAM memory 12 during transient states between power supply failure and restoration.

Figure 2:
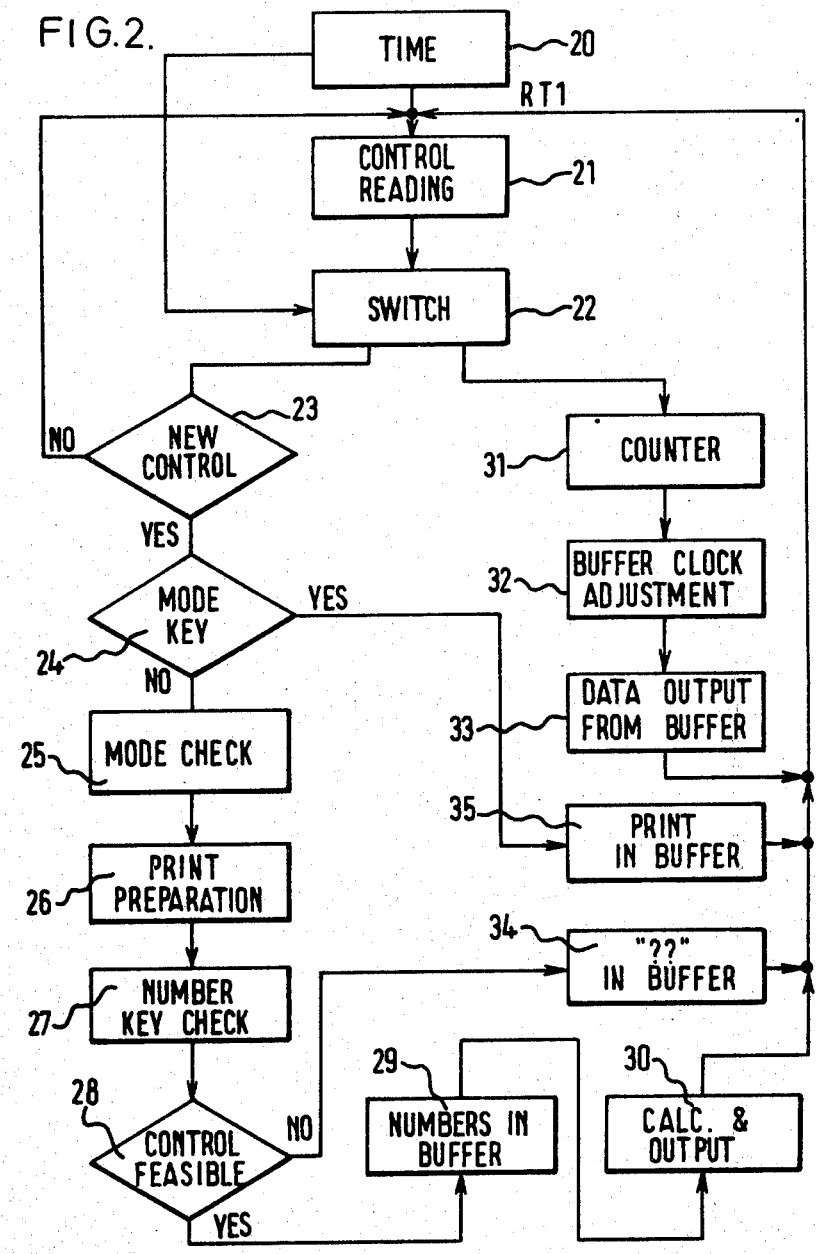
FIGS. 2, 3 and 4 are block diagrams of elementary logic functions performed by circuits of the receiver according to the present invention.
Figure 3:
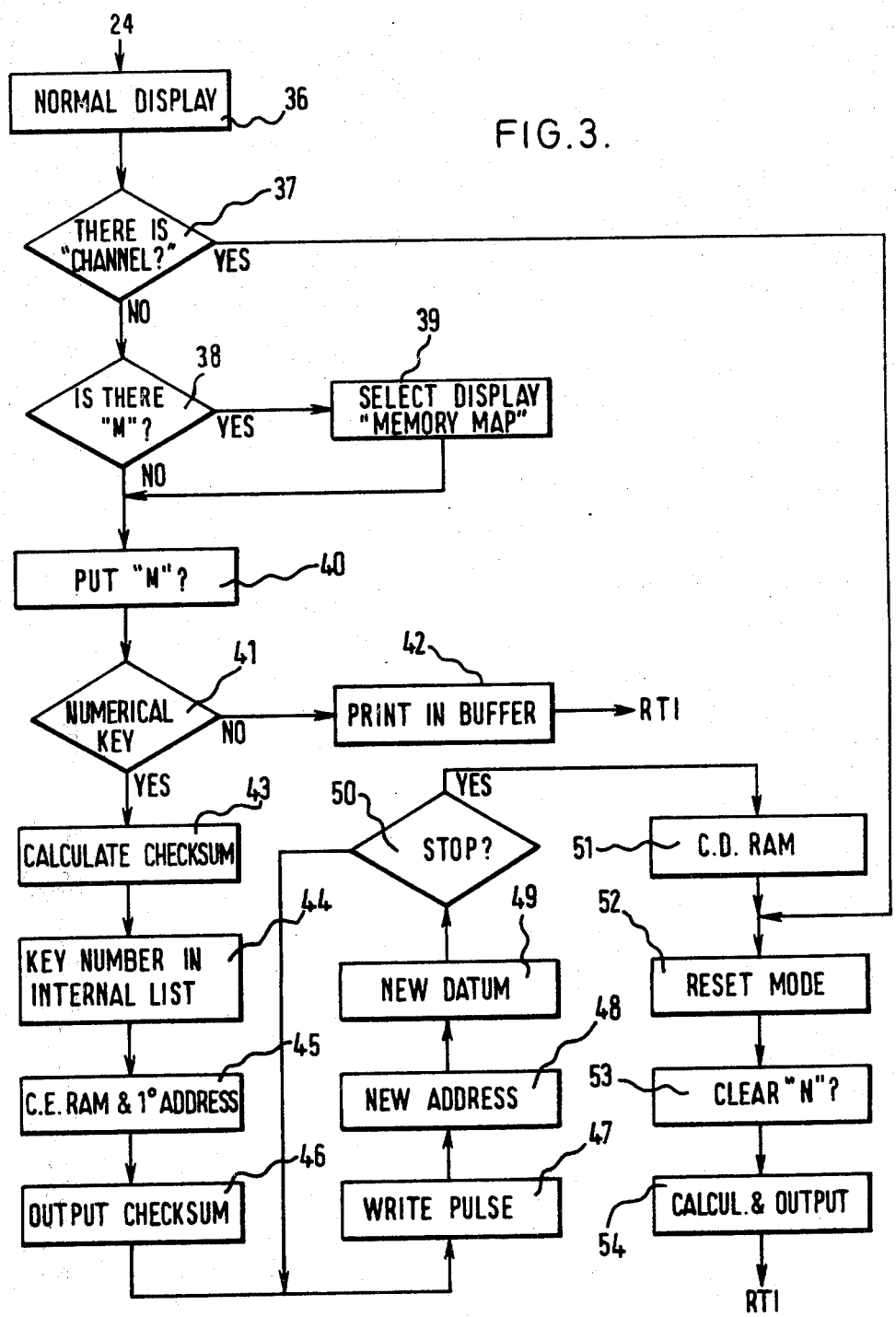
Figure 4:
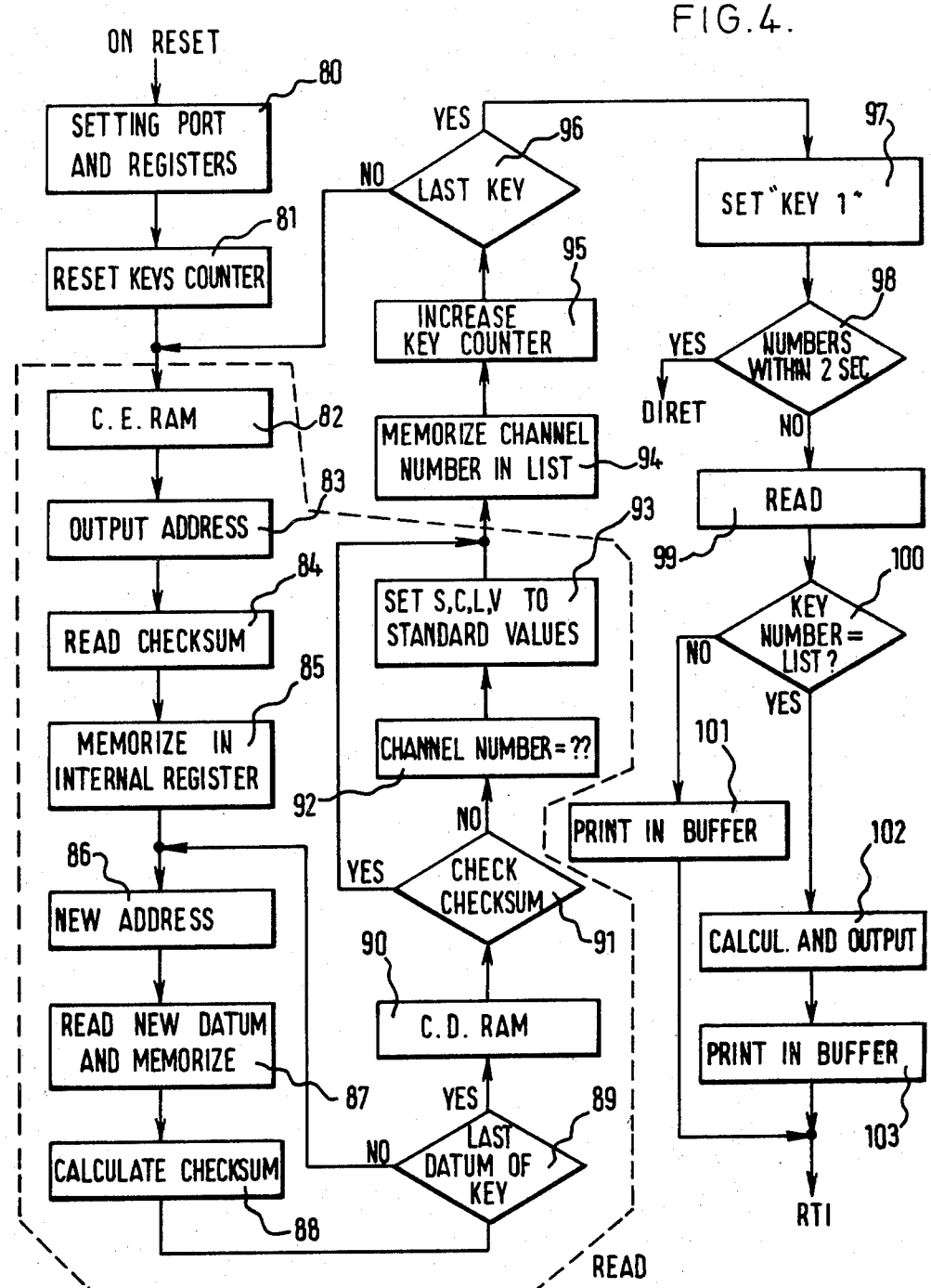

Operation of processing unit 11 is shown more clearly in the elementary logic funtion block diagrams in FIG. 2, 3 and 4, in which:

FIG. 2 shows operation mode and relative indication selection;

FIG. 3 shows updating of the data in outside RAM memory 12: and

FIG. 4 shows a data being called up from the outside RAM memory following restoration of the power supply.

Referring now to FIG. 2, numeral 20 indicates a timer which sets a switch circuit 22, with its output usually applied to block 23 and supplies an RTI signal to block 21 which reads the controls set on the keybaord. Block 21, via switch 22, supplies a signal to block 23 which ascertains the presence of a new order. The "NO" output supplies the RTI signal which reactivates reading block 21 while the "YES" output activates block 24 which ascertains whether the key pressed was a mode key. The "NO" output of block 24 activates block 25 which examines the operation mode selected and, in turn, activates block 26 which, depending on the mode chosen, combines and supplies the indication sequence to the character generator for display. Block 26 then activates block 27 which examines the number keys pressed and activates block 28 which ascertains whether the corresponding order is feasible.

The "NO" output of the block 28 (control not feasible, e.g. the number does not correspond to a standard number channel) activates a following block 34 which inserts question marks at appropriate points in the buffer to inform the user that the control is not feasible and transmits them to character generator 16 (FIG. 1). Block 34 then supplies an RTI signal to block 21 which reads the keyboard once more awaiting further instructions.

The "YES" output of block 28 activates block 29 which sends the channel or key numbers to the buffer, usually the numbers of the order received, transmits the numbers to the character generator and, finally, activates block 30 which calculates number N according to equation (3) and sends this number to programmable divider 4 (FIG. 1) to obtain the required tuning. Finally, block 30 supplies the RTI signal to block 21.

The "YES" output of block 24 activates block 35 which selects the display type and prepares the indication to be sent to the character generator (see also FIG. 3 and the following). Block 35 then supplies block 21 with the RTI signal. After a set length of time (about 4 milliseconds), depending on circuit 20, switch 22 positions itself with its output applied to count circuit 31 which, after a set number of pulses (about 250) per second, supplies a signal to block 32 which updates the clock numbers in the buffer and activates block 33 which sends the data contained in the buffer to the character generator and then supplies an RTI signal to block 21. Number 36 in FIG. 3 is a block that, if the key M has been pressed, selects the normal display and activates block 37 which ascertains whether the "CHANNEL ??" indication is present in the buffer or whether the selected channel is acceptable and, therefore, memorizable.

The "NO" output of block 37 activates block 38 which ascertains whether the "M?" indication is present in the buffer showing the device to be set for memorization.

The "YES" output of block 38 activates block 39 which selects the "MEMORY MAP" display. The "NO" output of block 38 and the output of block 39 activate block 40 which inserts the "M?" indication in the buffer showing the device is set for memorization and also activates block 41 which ascertains whether the last key pressed was a number key.

The "NO" output of the said block 41 activates block 42 which completes the indications in the buffer, supplies them to the display circuits and supplies an "RTI" signal to block 21 (FIG. 2). The "YES" output activates in turn:
- block 43 which calculates the "CHECKSUM" of data to be sent to the memory;
- block 44 which memorizes the channel number in one of the internal table cells corresponding to the number of the key pressed;
- block 45 which supplies the external RAM (12) memory circuit with a CHIP ENABLE signal and the address of the pressed key number;
- block 46 which supplies the RAM memory with "CHECKSUM" data.

Block 46, in turn, supplies an enabling signal to:
- block 47 which supplies the RAM memory with a "WRITE" signal;
- block 48 which supplies the RAM memory with a new address;
- block 49 which supplies new data (tuning, colour, brightness, volume, channel number);
- block 50 which ascertains data output is complete.

The "NO" output of the said block 50 supplies block 47 and the following blocks with an enabling signal. The "YES" output, on the other hand, supplies an enabling signal to block 51 which supplies the said memory with a CHIP DISABLE signal and enables in turn:
- block 52 which restores normal memory selection operation;
- block 53 which cancels the "M?" indication in the buffer (replacing the characters with "BLANKS";
- block 54 which calculates number N according to the equation, supplies the corresponding data to the programmable divider and supplies block 21 with an "RTI" signal.

Block 52 and the following blocks are also enabled by the "YES" output of the block 37.

The operation of the FIG. 3 blocks will be better understood with reference to FIG. 4 which shows operation during the initialing stages following the return of power supply and normal, that is, memory selection operation.

Numeral 80 in FIG. 4 is a block activated by an "ON RESET" signal supplies by block 15 (FIG. 1) which assigns initial preset values to the content of the internal registers and unit 11 input-output PORTS (FIG. 1) and activates block 81 which zeroes a key number count register.

The block 81 supplies an enabling signal to activate in turn:
- block 82 which supplies a CHIP ENABLE signal to the RAM memory;
- block 83 which supplies the RAM memory with a first address;
- block 84 which reads the "CHECKSUM" data from the RAM memory;
- block 85 which memorizes the data in an internal register.

Block 85 supplies an activating signal in turn to:
- block 86 which supplies a new address;
- block 87 which reads the new data from the RAM memory and memorises it in an internal register;
- block 88 which calculates the "CHECKSUM" of the read data;
- block 89 which ascertains whether the data read is the latest from the key in question.

The "NO" output of block 89 supplies an enabling signal to block 86 while the "YES" output activates in turn block 90, which supplies the RAM memory disabling signal, and block 91 which ascertains whether the CHECKSUM from the RAM memory corresponds with what has been calculated.

The "NO" output of block 91 activates in turn block 92, which assigns the channel number with the value corresponding to characters "??" (unacceptable, therefore rejected channel), and block 93 which assigns average preset values to tuning, colour, brightness and volume levels.

The output of block 93 and the "YES" output of block 91 activate in turn:
- block 94 which memorizes the channel number in one of 10 registers of processing unit 11, each of which is associated to one of the 10 number keys; this set of 10 registers will be called the inside table;
- block 95 which increases the key number count register;
- block 96 which ascertains whether all the data relative to all the 10 keys has been read.

The "NO" output of the said block 96 supplies an enabling signal to block 82 while the "YES" output activates in turn:
- block 97 which provides for normal (memory selection) operation mode on key 1;
- block 98 which ascertains whether two numbers have been struck one after the other within the space of two seconds.

The "YES" output of block 98 supplies a "DIRECT" signal to circuits not shown in the Figure and which provide for direct selection operation mode in the known way. The "NO" output activates block 99 consisting of the same blocks described above from 82 to 93 and enclosed by the dotted line in the Figure ("READ").

The block 99 activates block 100 which ascertains whether the channel number read by the memory is the same as that contained in the corresponding inside table cell. The "NO" output of block 100 activates block 101 which loads the buffer with appropriate display indications to show the content of the memory is no longer reliable, for example:

12:34:56
CHANNEL LOST
KEY 1

The "YES" output activates in turn:
- block 102 which calculates number N and supplies it, togehter with other necessary data, to programmable divider circuit 4 and tuner 2 of FIG. 1;
- block 103 which loads the buffer with appropriate display indications such as those shown in FIG. 1.

Both block 101 and 103 supply the "RTI" signal.

For further information concerning operation of the circuit, refer to U.S. Ser. No. 971,073, already mentioned, which describes a circuit partly similar to the present one. In the actual circuit, a Fairchild F8 microprocessor unit was chosen for processing unit 11 which consists of a 3850 C.P.U., 3861 P.I.O., 3853 S.M.I. and three PROM F93448 memories. Each of the said three PROM memories consists essentially of a connection matrix with a 512×8 format, input and address decoding circuits and output buffer circuits.

Each connection may be open or closed and represents permanent elementary data (bit) 1 or 0 respectively. Each group of 8 connections, addressed by one of the 512 address input combinations, represents an elementary 8-bit instruction or word (byte). By applying all the possible address combinations at the input, all the data contained in the ROM can be obtained at the output in word form.

These connections are described in the following tables for the circuit according to the present invention. The left-hand column shows the addresses, using hexadecimal notation, of the first of a group of 8 memory cells and the 8 right-hand ones the connections of the corresponding 8 memory cells in the group. Number 1 refers to an open connection with logic 1 at the output while O refers to a closed connection. As each memory cell consists of 8 connections, this means it can be represented with a combination of 8 binary figures. For the sake of simplicity, the hexadecimal system was used on the following tables, so that, for example, EA for base 16, which corresponds to 11101100 of base 2, indicates that the corresponding memory cell has connections 1, 2, 3, 5 and 6 open and the rest closed.

TABLE

| ADDRESS | CODES |
|---------|-------|
| M0000 = | 70 B6 BE BF B4 65 6F B1 |
| M0008 = | 5E 8F FE 04 6A 7A 5C 6D |
| M0010 = | 5C 66 74 5E 7F 58 18 07 |
| M0018 = | 5E 8F FE 70 57 28 05 B4 |
| M0020 = | 47 1F 57 24 1C 0B 41 5C |
| M0026 = | 47 25 0A 94 F1 20 C0 5A |
| M0030 = | B1 20 5D BD 70 BC 5B 06 |
| M0038 = | 52 62 6C 5C 6F 5C 28 04 |
| M0040 = | 1F 90 5E FF FF FF FF FF |
| M0048 = | FF FF FF FF FF FF FF FF |
| M0050 = | FF FF FF FF FF FF FF FF |
| M0058 = | FF FF FF FF FF 29 04 34 |
| M0060 = | 1B 62 6D 3C 94 26 1A 68 |
| M0068 = | 20 20 B5 4C 12 59 4C 1F |
| M0070 = | 12 12 12 C9 B4 0A 13 25 |
| M0078 = | 20 94 02 1F B5 25 24 4D |
| M0080 = | 20 20 B5 94 E7 70 B5 B4 |
| M0088 = | 29 03 31 A5 EB 84 D3 59 |
| M0090 = | 21 10 49 94 37 BB 5B 91 |
| M0098 = | C9 1A 52 73 BE 90 02 FF |
| M00A0 = | 1A 62 6F 70 CD 84 04 5E |
| M00A8 = | 70 5C 67 4B 21 1F 59 6F |
| M00B0 = | 25 09 81 37 00 C8 81 0C |
| M00B8 = | 49 F8 25 09 81 2D 28 04 |
| M00C0 = | 1F 70 04 49 25 0F 81 3B |
| M00C8 = | 29 04 EB 1A EB 5B 21 10 |
| M00D0 = | 20 FA 94 03 52 03 66 6B |
| M00D8 = | 5E Le 5C 67 6E 4C E8 84 |
| M00E0 = | 04 03 5D 5C 70 55 06 29 |
| M00E0 = | 04 03 5D 5C 70 55 06 29 |
| M00E8 = | 03 27 59 47 56 70 84 03 |
| M00F0 = | 49 1F 57 5E 46 5D E8 84 |
| M00F8 = | 03 70 06 00 C8 81 0E 29 |
| M0100 = | 02 02 25 0B 91 04 29 01 |
| M0108 = | DE 06 7F 57 02 25 00 84 |
| M0110 = | 17 67 6F 25 0F 84 60 29 |
| M0118 = | 04 AE 67 6C 03 5C 28 04 |
| M0120 = | 25 46 15 C7 51 90 3C 55 |
| M0128 = | 66 6D 4C 25 04 84 0A 25 |
| M0130 = | 01 73 5E 5D 94 E5 90 03 |
| M0138 = | 71 5C 67 6F 03 5E 8F FE |
| M0140 = | 66 5E 5C 67 6C 47 5C 28 |
| M0148 = | 05 B4 47 24 1D 0B 4C E1 |
| M0150 = | 84 11 2A 01 65 66 6E 16 |
| M0158 = | 5C 0A 1F 0B 25 3B 94 F8 |
| M0160 = | 90 2F 29 02 52 E0 D5 E2 |
| M0168 = | E3 DF FF FF FF FF FF FF |
| M0170 = | FF FF FF FF FF FF 66 70 |
| M0178 = | 55 4E E8 84 58 67 4C 25 |
| M0180 = | DD 94 04 20 FF 55 20 DD |
| M0188 = | 5D 7F 5C 47 E8 6C 94 04 |
| M0190 = | 29 03 27 47 5E 03 5D 75 |

TABLE-continued

| ADDRESS | CODES |
|---------|-------|
| M0198 = | 59 62 6B 41 CE 8F FE 6E |
| M01A0 = | 5C A1 EA B1 67 6C 4C 13 |
| M01A8 = | 13 CC CC B5 05 4C 24 1D |
| M01B0 = | 0B 41 5C 62 6E 4C 21 7F |
| M01B8 = | 6B B4 23 80 B4 23 80 B4 |
| M01C0 = | 01 1F B5 05 8F 05 41 68 |
| M91C8 = | 90 F0 4E 39 94 EC 70 B4 |
| M01D0 = | B5 A1 EA B1 70 57 06 03 |
| M01D8 = | 67 6F 5E 5C 90 75 49 13 |
| M01E0 = | 18 24 16 59 45 25 00 81 |
| M01E8 = | 04 29 04 AE 49 62 6B CC |
| M01F0 = | 5C 49 6E CC 5C 67 6C 70 |
| M01F8 = | 55 CC 72 59 81 A4 70 57 |
| M0200 = | 90 51 49 23 1F 94 17 20 |
| M0208 = | E2 5E 20 DF 5C 65 68 4A |
| M0210 = | 04 7F 5D 5C 6B 5D 5C 6E |
| M0218 = | 5D 5D 57 90 33 46 E8 84 |
| M0220 = | 2F 46 25 05 91 0E 00 24 |
| M0228 = | 03 04 24 65 0B 46 5D 47 |
| M0230 = | 5C 90 04 28 04 1F 7F 57 |
| M0238 = | 68 4D 15 CC 25 23 81 10 |
| M0240 = | 28 04 1F 90 C9 7F 66 5E |
| M0248 = | 5C 20 80 51 28 04 1F 29 |
| M0250 = | 03 27 67 6A 03 5E 8F FE |
| M0258 = | 66 5E 5D 67 70 50 53 41 |
| M0260 = | 05 25 01 81 E1 25 79 91 |
| M0268 = | DD F8 25 09 91 D8 70 CE |
| M0270 = | 91 08 70 CC 91 04 03 5D |
| M0278 = | 5E 66 41 25 69 81 0B F8 |
| M0280 = | 2A 05 A0 8E 24 02 51 16 |
| M0288 = | 53 41 14 5D 13 59 13 13 |
| M0290 = | C9 59 41 F8 5F C9 51 25 |
| M0298 = | 14 91 1F 13 C1 13 C1 59 |
| M02A0 = | 01 25 69 81 07 03 5D 79 |
| M02A8 = | 8E 16 5E 41 25 04 20 45 |
| M02B0 = | 81 05 74 50 20 AF C3 90 |
| M02B8 = | 11 20 20 C1 51 13 13 13 |
| M02C0 = | 59 41 14 12 24 08 50 20 |
| M02C8 = | 52 C9 51 40 19 13 13 50 |
| M02D0 = | 70 62 6B CC 81 04 70 90 |
| M02D8 = | 07 25 20 81 03 20 20 5C |
| M02E0 = | C8 24 F1 59 41 14 12 12 |
| M02E8 = | C0 50 41 13 13 C9 59 40 |
| M02F0 = | 19 18 B1 01 25 70 84 08 |
| M02F8 = | 25 74 84 04 70 90 02 72 |
| M0300 = | C9 18 B0 01 51 03 CC 67 |
| M0308 = | 68 84 1D 50 20 FB 5C 81 |
| M0310 = | 08 20 FD 5C 41 18 1F 50 |
| M0318 = | 20 67 59 70 D9 30 94 FD |
| M0320 = | 69 59 14 5D 49 F8 5C 20 |
| M0328 = | 20 53 A1 22 40 B1 28 03 |
| M0330 = | 49 00 25 C9 91 11 84 04 |
| M0338 = | 29 00 61 70 06 57 20 FD |
| M0340 = | 54 03 67 6F 5E 5C 29 00 |
| M0348 = | 60 2A 05 94 65 68 74 59 |
| M0350 = | 7C 50 70 C5 91 7C 20 80 |
| M0358 = | B4 94 3C 2A 05 71 16 B4 |
| M0360 = | CA B4 39 94 FA 0A 25 34 |
| M0368 = | 94 17 67 6F 4C E8 84 08 |
| M0370 = | 6C 70 CC 91 08 90 08 44 |
| M0378 = | 25 7F 94 03 7A 8E 66 6E |
| M0380 = | 4C 24 30 18 B4 CA B4 0A |
| M0388 = | 1F 0B 30 94 F4 CA 84 3A |
| M0390 = | 7B 58 75 50 90 C9 16 B4 |
| M0398 = | CA B4 39 94 FA 62 4C 12 |
| M03A0 = | 12 12 63 5D 84 19 0A 5C |
| M03A8 = | 02 24 0D EC 20 D5 94 02 |
| M03B0 = | 42 5C 4E B4 CA B4 30 3D |
| M03B8 = | 94 F9 70 C0 84 09 20 DF |
| M03C0 = | B4 CA B4 30 94 F9 0A 23 |
| M03C8 = | 1B 84 49 74 59 7C 50 90 |
| M03D0 = | C6 63 6D 4C 64 6F 5C 70 |
| M03D8 = | B4 20 80 B4 63 6D 20 DF |
| M03E0 = | B4 CA B4 20 DF B4 CA B4 |
| M03E8 = | 0A 1F 0B 23 28 84 25 4C |
| M03F0 = | 14 25 07 94 0F 20 DF B4 |
| M03F8 = | CA B4 2A 05 AA 4C F8 8E |
| M0400 = | 16 90 09 24 30 18 B4 CA |
| M0408 = | B4 4C F8 24 30 18 B4 CA |
| M0410 = | B4 90 CC B4 33 81 08 53 |
| M0418 = | 55 06 A1 21 BF B1 1C 20 |

TABLE-continued

| ADDRESS | CODES |
|---|---|
| M0420 = | 40 B5 70 B5 1C 62 6B 20 |
| M0428 = | 10 5E 20 2A 51 20 2A 5E |
| M0430 = | 20 2A 5C 1C 66 6C 3D 94 |
| M0438 = | 06 3C 94 03 71 5C 72 C4 |
| M0440 = | 21 1F 94 1C C5 84 19 62 |
| M0448 = | 6C 4C 59 02 24 04 0B 49 |
| M0450 = | CC 25 64 81 05 20 64 90 |
| M0458 = | 06 25 00 91 02 70 5C 34 |
| M0460 = | 44 25 7F 84 40 25 00 94 |
| M0468 = | 3F 72 59 20 FE 54 65 6F |
| M0470 = | 20 67 DC 5E 14 CC 5D 25 |
| M0478 = | 05 81 1C 70 5E 5C 6C 39 |
| M0480 = | 94 EF 69 20 67 DC 5E 14 |
| M0488 = | CC 5D 25 01 81 09 4C 25 |
| M0490 = | 03 81 04 70 5E 5D 4C F8 |
| M0498 = | 5C 6F 4C 21 01 C2 25 1C |
| M04A0 = | 20 A0 91 06 28 03 49 20 |
| M04A8 = | 60 05 70 04 1B 0C 47 E8 |
| M04B0 = | 84 12 62 6C 4C E9 84 21 |
| M04B8 = | 67 70 CE 91 04 20 FA 5C |
| M04C0 = | 49 90 17 02 25 0C 94 11 |
| M04C8 = | 66 6D 4C 25 01 73 5E 5D |
| M04D0 = | 84 07 62 68 4E 5D 70 5C |
| M04D8 = | 70 62 6C 5C 18 24 C3 52 |
| M04E0 = | 71 55 57 67 6F 03 5E 5C |
| M04E8 = | 29 03 27 4B 25 1F 94 04 |
| M04F0 = | 29 02 02 F8 59 25 09 81 |
| M04F8 = | 6F 6C 70 CC 81 02 70 57 |
| M0500 = | 49 13 18 24 16 25 FE 91 |
| M0508 = | 08 4V E2 84 DC 49 06 71 |
| M0510 = | 50 03 5E 5C 6E 20 E2 5D |
| M0518 = | 02 24 F5 5C 25 02 84 13 |
| M0520 = | 91 2F 71 5C 47 C0 81 02 |
| M0528 = | 79 25 09 81 02 70 57 29 |
| M0530 = | 01 43 20 10 62 6B 5E 70 |
| M0538 = | C0 91 03 24 66 D1 25 01 |
| M0540 = | 92 03 20 79 25 79 81 02 |
| M0548 = | 72 51 28 04 2A 29 02 52 |
| M0550 = | 40 13 13 62 6B CC 81 05 |
| M0558 = | 20 1C 90 DB 25 1C 81 04 |
| M0560 = | 70 90 D4 5E 41 90 D8 57 |
| M0568 = | 77 56 03 5E 8F FE 29 01 |
| M0570 = | 1A DF EF DF DF DF ED DF |
| M0578 = | DF FC FE F1 FE F3 FA DF |
| M0580 = | DF FE DF DF EB FE EC EB |
| M0588 = | F0 DF DF FE DF DF DF DF |
| M0590 = | DF DF DF DF DF CE DF E9 |
| M0598 = | DF C8 DF F3 DF CF DF FC |
| M05A0 = | 05 07 14 00 01 03 05 07 |
| M05A8 = | 07 07 D1 D2 D3 D4 D5 D6 |
| M05B0 = | D7 D8 D9 DC A1 21 7F B1 |
| M05B8 = | 70 59 47 13 13 C7 C7 05 |
| M05C0 = | B5 A4 62 6E 5C 6B 90 02 |
| M05C8 = | 51 01 1F 05 B5 A4 C9 59 |
| M05D0 = | A4 8F F6 51 A1 22 80 B1 |
| M05D8 = | 70 B5 6E 4C E9 21 7F 94 |
| M05E0 = | 08 6B 4C 25 20 91 02 1C |
| M05F0 = | FF FF FF FF FF FF FF FF |
| M05F8 = | FF FF FF FF FF FF FF FF |

The above tables contain, in coded form, one possible sequence of elementary operations for performing, via the microprocessor system (e.g., the Fairchild F8 microprocessor) indicated, the functions shown in the block diagrams and foregoing description. To make this clearer, let use take as an example M0000=70 B6 BE BF B4 65 6F B1. This indicates that the memory cells from 0000 to 0007 contain the hexadecimal date 70, B6, BE, BF, B4, 65, 6F and B1, respectively, corresponding to zeroing of PORTS n.6, n.14, n.15, n.4, n.1 and setting of the ISAR register to 57. For further information, refer to the manuals published by Fairchild on the F8 system, such as their "guide to Programming" n.67095664 issued by Fairchild Micro Systems of San Jose, Calif.

With the exception of block 54, the blocks shown in FIG. 3 correspond to the memory section between addresses 0176 and 01DD on Table 1. The blocks shown in FIG. 4 correspond to the following memory zones:

blocks 82 to 93(READ): addresses 05B4 to 05ED;
blocks 80 to 81 and 94 to 97: addresses from 0000 to 0042;
blocks 98 to 103; addresses from 0127 to 0169.

The operation of the described embodiment of the present invention will be clear from the description given. In particular:

Provision is made for displaying the channel situation in the memory using the 10 inside registers of processing unit 11 (inside Table). These are loaded when power returns following a power cut by copying the data in the outside memory if it is valid (blocks 80-96 of FIG. 4). They are updated, of course, (blocks 43-50 of FIG. 3), whenever any further memorizing operations are performed. Data acceptance is checked out by calculating the sum (CHECKSUM) of the give figures (block 88 of FIG. 4) relative to each key (channel, tuning, colour, brightness and volume) and comparing it with the same sum (block 91 of FIG. 4) stored as a sixth figure in the memory (blocks 43-46 of FIG. 3) during the memory storage operation.

If the read data is not found to be valid, the device inserts two question marks on the Table (??) and assigns average preset values to the adjustments so as to avoid dangerous or unwanted conditions (blocks 92 and 93 of FIG. 4).

When data relative to a given key is called up from the memory, the device checks that the channel number read in the memory corresponds with the number on the inside table (block 100 of FIG. 4). In this way, the device can inform the user, if the numbers do not correspond, that the memory condition is no longer reliable (block 101 of FIG. 4) owing to the fact, for example, that the battery voltage is falling below the accepted minimum.

A point to be noted is that the numbers will only correspond if no alterations have been made to any of the six memorized figures. If the CHECKSUM does not correspond, the "READ" block inserts "??" characters in place of the read channel number. If, on the other hand, the user calls up a key for which nothing has been memorized, the numbers will still correspond because both the read channel number (block 92) and the number on the inside table (block 94) have been replaced with "??" characters. In other words, the memory is only reported to be unreliable if any alterations whatsoever have been made to the memorized data.

Needless to say, this type of memory check cannot inform of any alterations to memory content made during temporary power failure. If needed, however, a further check can easily be made when power supply is restored. This type of check, which is not performed by the circuits described above by way of an example, is provided for as follows:

Whenever a channel is memorized, the number of taken keys must also be memorized in one of the outside memory cells. For this to be done, all that is needed is to count, using the inside table, the number of keys associated to a valid channel (that is, keys not associated to "??" characters).

When power is returned after temporary failure, when or after loading the inside table, just count the number of valid channels read by the memory (after the CHECKSUM) and compare it with the number memorized in the outside memory as described above.

Any combination of memorized data can, of course, be stored in the outside memory in place of the number of valid channels.

Figure 5:
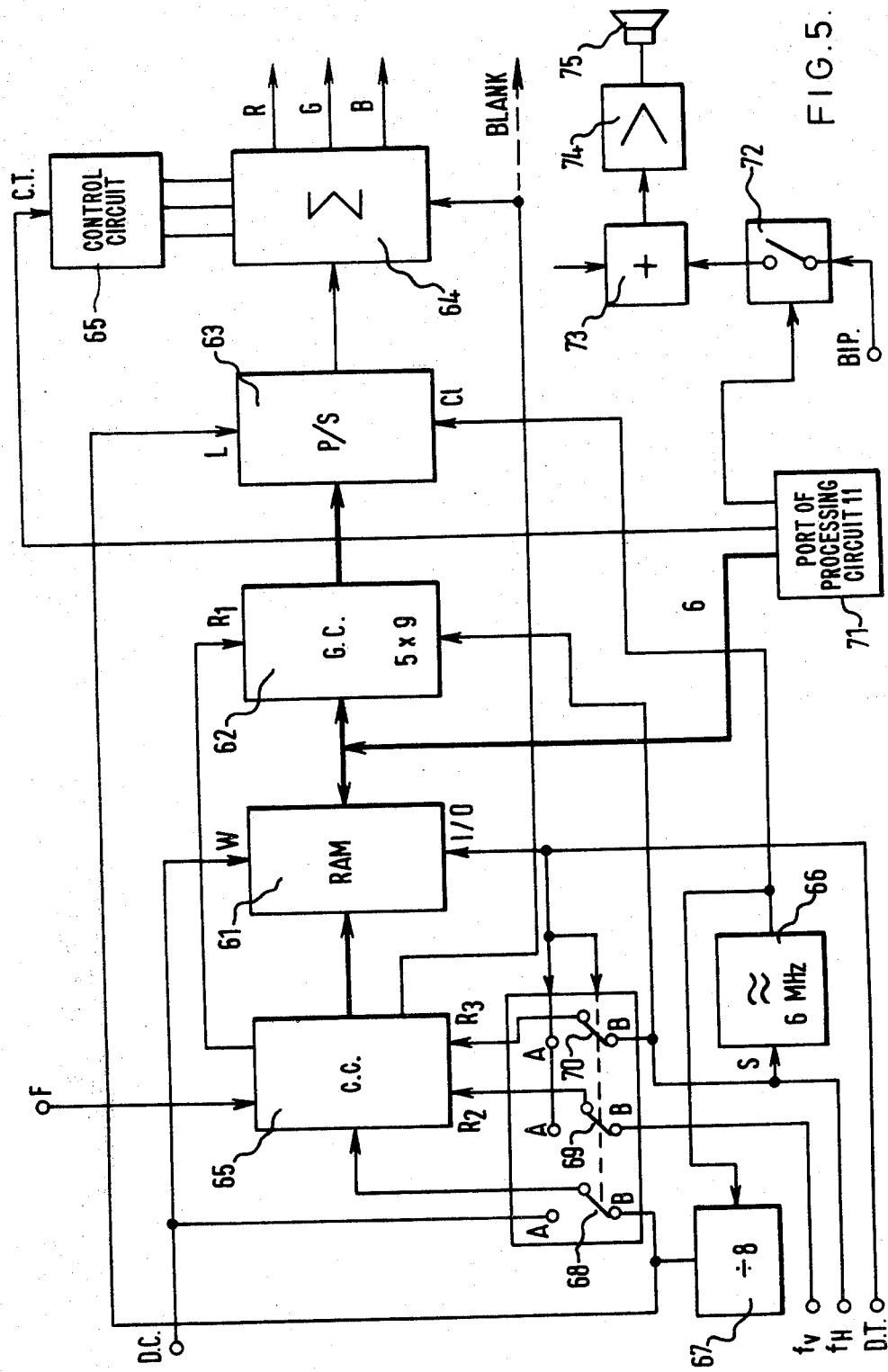
FIG. 5 shows a number of circuits of the receiver of FIG. 1 in greater detail.

FIG. 5 shows a more detailed version of the FIG. 1 block diagram of character generator 16.

Number 60 in FIG. 5 indicates a character count circuit for supplying the addresses to character memory 61. This has a 48×6 format for containing the 48 characters transmitted periodically by processing unit 11.

The six IMPUT/OUTPUT terminals of the said memory are connected to six output terminals of PORT 71 of processing unit 11. These are also connected to six inputs of character ROM 62. This may be a Fairchild 3258 type, for example, for memorizing 64 characters for each of which it supplies an image consisting of a 5×7 point matrix. Each character is separated vertically from the next by two lines of blanks. a built-in centre, which receives a clock signal with horizontal scanning frequency RH from the television circuits and a reset signal "R" from circuit 60, scans the following point lines of the said matrix.

The five outputs of the said ROM 62 are connected to a parallel-series converter circuit 63 which transforms the 5 signals received from the said 5 outputs into a series signal. It also adds a suitable number of blanks (e.g. 3) on to the end of the said 5 signals to separate the characters horizontally.

Circuit 63 receives a clock signal from oscillator circuit 66 the frequency of which determines the width of each of the characters displayed on the screen. It also receives a LOAD signal "L" each character (every 5+3=8 clock cycles in the example shown) from divider circuit 67 which, in turn, receives the clock signal from oscillator circuit 66. The signal thus received at the output of converter 63 is sent to combiner circuit 64 consisting of known logic elements (e.g. three 2-input AND gates each with a first input connected to the output of circuit 63 and a second connected to one of the outputs of circuit 65) which sends the said signal to one or more of its three outputs marked R, G and B in the Figure, in response to the same number of control signals supplied by control circuit 65. The said outputs R, G and B are connected, in the known way, to the amplifier circuits of the colour signals on the set so that the signals supplied by circuit 64 are added to the video ones of the received television signal.

Depending on the instructions received from circuit 65, it is possible to obtain the indications in any one of the three primary colour combinations.

In FIG. 5, the control circuit 65 receives a control signal from an output of PORT 1 of circuit 11 (FIG. 1) so that the indications are displayed in green when the system is set to the first keyboard and yellow when it is set to the second.

Numbers 68, 69 and 70 indicate three switch circuits, similar to one another, controlled in parallel by a control signal DT supplied by a bit of PORT 1 of processing unit 11 in FIG. 1. Depending on the DT signal, these three switch circuits enable the FIG. 5 circuits to be set so as to load the data in memory 61 when the DT signal is present (high) and vice versa, to set the same circuits for transmitting the data from the said memory to outputs R, G and B when the DT signal is absent (low) or when unit 11 is not transmitting characters to memory 61 (for display updating). To do this, when the DT signal is present, switches 68, 69 and 70 are positioned as shown by letter A in FIG. 5. This causes a reset pulse to be applied to terminals R2 and R3 of count circuit 60 and memory 61 is set to INPUT by the same DT signal applied to the input-output I/O control terminal.

Via switch circuit 68, count circuit 60 receives clock pulses DC from an output terminal of processing unit 11 of FIG. 1 (PORT 4). The same DC signal is also sent to the write control input "W" of memory 61.

In this way, for each clock pulse it receives, counter 60 supplies RAM memory 61 with addresses from 0 to 47. At the same time, unit 11 supplies the 48 signals (at PORT 4) received at the data input of the same memory so that they are memorised in the corresponding cells as a result of the "W" pulses.

When the DT, signal is absent, on the other hand, (switches in position B), character counter 60 receives clock signals from circuit 66 via divider 67, reset signals with vertical scanning frequency FV at terminal R2, reset signals with horizontal scanning frequency FH at terminal R3 and a format-change signal "F" from processing unit 11. In this way, it supplies memory 61 with suitable addresses for arranging the 48 display characters in three 16-character lines, should signal "F" be present, or else it supplies the said memory with only the first sixteen addresses for displaying a single 16-character line when signal "F" is absent. Counter (6) also supplies combiner circuit 64 with a disabling signal for disactivating it during the remaining television picture time. In this way, only a certain part of the screen is displayed, e.g. the top left-hand corner. If needed, the same disabling signal can be used for supplying a BLANK signal at an appropriate point in the television video amplification chain so as to blacken the background of the display to make the characters more visible.

A further output of circuit 71 (PORT 4) of unit 11) controls a switch 72, between a BIP signal (which can be picked up at a appropriate point on the circuit, e.g. at the output of divider 7 of FIG. 1) and a first input of an adding circuit 73, whose second input receives the audio B.F. signal of the received television signal picked up downstream from the manual volume adjuster. The output of the said adding circuit is connected to the input of the B.F. amplifier 74, on the set which pilots the loudspeaker 75. In this way, under given circumstances, processing unit 11 can control the sounding of an alarm for warning the user.

The said circumstances may be:
when the "M" memory key is pressed. The alarm reminds the user that the key has been pressed so as to prevent him from altering the content of the memory by mistake;
when an unperformable instruction is given (e.g. the number of an inexisting channel or time) etc.
when the maximum allowable limits have been reached for certain adjustments such as fine tuning corrections.

Of course, it may also prove useful to apply the alarm system shown in FIG. 5 in connection with analogue adjustments, for example, when the maximum allowed level has been reached.

The advantages of illustrated embodiment of the present invention will be clear from the foregoing description. However, a number of variations can be made. For example, in the description, it was supposed a particular type of 8-bit microprocessor system was used with a separate CPU and ROM. It is possible, and even convenient, to use other types of microprocessors with a higher number of internal RAM registers (e.g. 128) or a so-called monochip containing an internal RAM and timer circuit, besides the ROM, or a 16-bit microprocessor.

It may even prove useful to fit the receiver with a remote control. In this case, a keyboard similar to the one described is combined on the portable transmitter part of the remote control system. A further variation, to avoid duplicating the control keyboard, could be to provide accommodation in the receiver housing with electric contacts in which to connect the transmitter part for operating the local control.

Though the example given applies to a television set, it is clear that the principles of the present invention may be applied to other types of signal receivers, for example, a radioreceiver which may be fitted with a LED diode alphanumerical display or equivalent for displaying, among other things, the station map stored in the memory.

Many other variations can be made without, however, departing from the scope of the present invention as defined in the claims.

We claim:

1. Apparatus for use with a television receiver, said apparatus comprising:
    (A) tuner means for tuning said television receiver to a frequency determined by a control signal applied thereto;
    (B) display means for displaying visual information;
    (C) control means operable in a direct selection tuning mode, a memory selection tuning mode and a memory display tuning mode;
    (D) a keyboard including a plurality of keys, said keyboard enabling the operation of said television receiver to select the mode of operation of said control means and to enter frequency data indicative of the desired tuning frequency of said tuner means;
    (E) memory means having a plurality of storage locations, each of said storage locations being capable of storing key information relating a respective one of said keys to a desired tuning frequency; and
    (F) said control means being electrically connected to said tuner means, said display means, said keyboard and said memory means, said control means for:
        (1) adjusting the value of said control signal to cause said tuner means to tune to a frequency determined by frequency data entered into said keyboard by the operator of said television receiver when said control means is operated in said direct selection tuning mode;
        (2) adjusting the value of said control signal to cause said tuner means to tune to one of said tuning frequencies stored in said memory means when said control means is operated in said memory selection tuning mode;
        (3) causing said display means to display memory information indicating which of said storage locations contains key information and which of said storage locations does not contain key information when said control means is operated in said memory display mode.

2. Apparatus as claimed in claim 1, wherein said control means causes said display means to display memory information indicating the specific key information stored in said storage locations containing key information.

3. Apparatus as claimed in claim 1, wherein said control means adjusts the value of said control signal to cause said tuner means to tune to that tuning frequency stored in the specific said storage location which corresponds to the last said key activated by the operator of said television receiver when aid control means is operated in said direct selection tuning mode.

4. Apparatus as claimed in claim 1, wherein said turner means includes a controllable oscillator and a control loop for determining the frequency of said oscillator as a function of said control signal, said control signal being a binary number N, said control loop comprising:
    frequency dividing means for obtaining a first signal having a frequency determined by the frequency of said controllable oscillator and said number N;
    means for generating a second signal having a predetermined frequency;
    comparator means for comparing the frequencies of said first and second signals and for generating a third signal indicative of the difference between the frequency of said first and second signals, said third signal being applied to said controllable oscillator and determining the frequency of said controllable oscillator.

5. Apparatus as claimed in claim 1, wherein said television receiver includes a display screen and where said display means includes said display screen.

6. Apparatus as claimed in claim 1, wherein said control means is also operable in a data entry mode wherein said control means causes key information entered into said keyboard to be stored in one or more storage locations of said memory means.

7. Apparatus as claimed in claim 1, wherein said control means causes said display means to display said memory information in the form of a tuning table which indicates whether or not key information is stored in each of said storage locations and which further indicates the specific key information stored in each storage location containing key information.

8. Apparatus as claimed in claim 1, wherein the said control means includes a processing unit for memorizing, on an internal register table, data corresponding to said key information stored in said storage location of said memory means, as well as means for converting said data into coded signals for display by said display means.

9. Apparatus as claimed in claim 9, wherein said display means includes a character generator connected to said control means.

10. Apparatus as claimed in claim 9, wherein said control means is also for causing said display means to display alphanumerical data indicative of said frequency being tuned into and/or the adjustment levels of one or more controls on said television receiver.

11. Apparatus as claimed in claim 10, wherein said control means ascertains the operation mode selected by the operator of said television receiver, ascertains the last control selected by the operator of said television receiver, and causes said display means to display said alphanumerical data.

12. Apparatus as claimed in claim 11, wherein said control means calculates a combination of all the data to be memorized relative to a given tuning frequency, memorizes said calculated combination, recalculates said combination when said data is called up from said memory means, rereads the memorized combination, compares the said memorized and recalculated combinations, and informs the user if said two combinations are not equal.

13. Apparatus for use with a television receiver, said apparatus comprising:
(A) a keyboard including a plurality of keys;
(B) memory means for storing receiver operation information indicating a desired tuning frequency as well as other desired operating parameters of said television receiver;
(C) said keyboard permitting the operator of said television receiver to enter said receiver operation information into said memory means and also to read stored receiver operation information out of said memory means;
(D) control means responsive to the operation of said keyboard an operable in a first mode wherein new receiver operation information is read into said memory and a second mode wherein said stored receiver operation information is read out of said memory and causes said television receiver to be operated in accordance with said receiver operation information, said control means:
(1) calculating a first numerical vaule corrsponding to a predetermined combination of new receiver operation information as it is first read into said memory means;
(2) memorizing said first numerical value;
(3) calculating a second numerical value corresponding to said predetermined combination of stored receiver operation information as said stored receiver information is read out of said memory; and
(4) comparing said first and second numerical values.

14. Apparatus as claimed in claim 13, further comprising means for informing the operator of said television receiver if said first and second numerical values are not equal.

15. Apparatus as claimed in claim 13, wherein said other desired operating parameter includes desired adjustment levels of operating parameters of said television receiver and wherein said apparatus further comprises means for assigning average preset values to these levels if the said data is not found to be valid.

* * * * *